United States Patent
Ganai et al.

(10) Patent No.: US 7,203,917 B2
(45) Date of Patent: Apr. 10, 2007

(54) EFFICIENT DISTRIBUTED SAT AND SAT-BASED DISTRIBUTED BOUNDED MODEL CHECKING

(75) Inventors: Malay Ganai, Plainsboro, NJ (US); Aarti Gupta, Princeton, NJ (US); Zijiang Yang, Northville, MI (US); Pranav Ashar, Belle Mead, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 256 days.

(21) Appl. No.: 10/795,384

(22) Filed: Mar. 9, 2004

(65) Prior Publication Data

US 2004/0210860 A1  Oct. 21, 2004

Related U.S. Application Data

(60) Provisional application No. 60/463,762, filed on Apr. 18, 2003, provisional application No. 60/461,254, filed on Apr. 7, 2003.

(51) Int. Cl.
*G06F 17/50* (2006.01)

(52) U.S. Cl. .............................. 716/5; 716/7
(58) Field of Classification Search ............... 716/4–5, 716/1, 7
See application file for complete search history.

(56) References Cited

U.S. PATENT DOCUMENTS

| 5,469,367 A | * | 11/1995 | Puri et al. ...................... 716/18 |
| 6,415,430 B1 | * | 7/2002 | Ashar et al. ................... 716/18 |
| 6,442,732 B1 | * | 8/2002 | Abramovici et al. ........... 716/4 |
| 6,496,961 B2 | * | 12/2002 | Gupta et al. .................... 716/5 |

* cited by examiner

*Primary Examiner*—Thuan Do
*Assistant Examiner*—Binh Tat
(74) *Attorney, Agent, or Firm*—Sughrue Mion, PLLC

(57) ABSTRACT

There is provided a method of solving a SAT problem comprising partitioning SAT-formula clauses in the SAT problem into a plurality of partitions. Each of said plurality of partitions is solved as a separate process each, thereby constituting a plurality of processes where each of said process communicates only with a subset of the plurality of processes.

27 Claims, 6 Drawing Sheets

```
SAT_Solve() {
    while(1) {
      if (Decide()) {
        while(Deduce() == conflict) {
          blevel = Diagnose();
          if (blevel == 0)
            return UNSAT;
          else
            backtrack(blevel);
        }
      }
      else
        return SAT;
    }
}
```

FIG. 2

```
//Input: Bound k, Property Node p
    //Output: Witness/No Witness
    BMC(k,P) {
        for (i=0; i<=k ; i++) {
            // Unroll the circuit by a time frame
            Unroll(P,i);
            // solve the Boolean constraint
            // due to the Property at depth i
            is_sat = SAT(P,i);
            if (is_sat) return WITNESS;
        }
        return NO_WITNESS;
    }
```

FIG. 3

Ts, Tr: Master Send and Receive Time Stamp
ts, tr: Client Send and Receive Time Stamp
Tw: Master Wait Time Stamp for the message

EFFICIENT DISTRIBUTED SAT AND SAT-BASED DISTRIBUTED BOUNDED MODEL CHECKING

I.A. RELATED APPLICATIONS

This Application claims priority from co-pending U.S. Provisional Applications Ser. No. 60/463,762 filed Apr. 18, 2003, and 60/461,254 filed Apr. 7, 2003, the contents of which are incorporated herein by reference.

I.B. FIELD

The present disclosure teaches techniques related to distributed Boolean satisfiability test (SAT) as well as techniques for performing bounded model checking using such techniques.

I.C. BACKGROUND

1. References

The following papers provide useful background information, for which they are incorporated herein by reference in their entirety, and are selectively referred to in the remainder of this disclosure by their accompanying reference numbers in square brackets (i.e., [3] for the third numbered paper by K. L. McMillan):

[1] A. Silburt, A. Evans, G. Vrckovik, M. Diufrensne, and T. Brown, "Functional Verification of ASICs in Silicon Intensive Systems," presented at DesignCon98 On-Chip System De-sign Conference, 1998.

[2] E. M. Clarke, O. Grumberg, and D. Peled, Model Checking: MIT Press, 1999.

[3] K. L. McMillan, Symbolic Model Checking: An Approach to the State Explosion Problem: Kluwer Academic Publishers, 1993.

[4] R. E. Bryant, "Graph-based algorithms for Boolean function manipulation," IEEE Trans-actions on Computers, vol. C-35(8), pp. 677–691, 1986.

[5] A. Biere, A. Cimatti, E. M. Clarke, M. Fujita, and Y. Zhu, "Symbolic model checking using SAT procedures instead of BDDs," in Proceedings of the Design Automation Conference, 1999, pp. 317–320.

[6] P. Bjesse and K. Claessen, "SAT-based verification without state space traversal," in Proceedings of Conference on Formal Methods in Computer-Aided Design, 2000.

[7] M. Ganai and A. Aziz, "Improved SAT-based Bounded Reachability Analysis," in Proceedings of VLSI Design Conference, 2002.

[8] P. A. Abdulla, P. Bjesse, and N. Een, "Symbolic Reachability Analysis based on {SAT}-Solvers," in Proceedings of Workshop on Tools and Algorithms for the Analysis and Construction of Systems (TACAS), 2000.

[9] J. P. Marques-Silva and K. A. Sakallah, "GRASP: A Search Algorithm for Propositional Satisfiability," IEEE Transactions on Computers, vol. 48, pp. 506–521, 1999.

[10] H. Zhang, "SATO: An efficient propositional prover," in Proceedings of International Conference on Automated Deduction, vol. 1249, LNAI, 1997, pp. 272–275.

[11] M. Moskewicz, C. Madigan, Y. Zhao, L. Zhang, and S. Malik, "Chaff: Engineering an Efficient SAT Solver," in Proceedings of Design Automation Conference, 2001.

[12] M. Ganai, L. Zhang, P. Ashar, and A. Gupta, "Combining Strengths of Circuit-based and CNF-based Algorithms for a High Performance SAT Solver," in Proceedings of the Design Automation Conference, 2002.

[13] A. Kuehlmann, M. Ganai, and V. Paruthi, "Circuit-based Boolean Reasoning," in Proceedings of Design Automation Conference, 2001.

[14] B. W. Wah, G.-J. Li, and C. F. Yu, "Multiprocessing of Combinational Search Problems," IEEE computer, pp. 93–108, 1985.

[15] H. Zhang, M. P. Bonacina, and J. Hsiang, "PSATO: a Distributed Propositional Prover and its Application to Quasigroup Problems," Journal of Symbolic Computation, 1996.

[16] Y. Zhao, "Accelerating Boolean Satisfiability through Application Specific Processing.," Ph.D. Thesis. Princeton, 2001.

[17] C. Powley, C. Fergusion, and R. Korf, "Parallel Heuristic Search: Two Approaches," in Parallel Algorithms for Machine Intelligence and Vision, V. Kumar, P. S. Gopalakrish-nan, and L. N. Kanal, Eds. New York: Springer-Verlag, 1990.

[18] B. Jurkowiak, C. M. Li, and G. Utard, "Parallelizing Satz Using Dynamic Workload Balancing," presented at Workshop on Theory and Applications of Satisfiability Testing, 2001.

[19] M. Boehm and E. Speckenmeyer, "A Fast Parallel SAT-solver—Efficient Workload Balancing," presented at Third International Symposium on Artificial Intelligence and Mathematics, Fort Lauderdale, Fla., 1994.

[20] U. Stern and D. L. Dill, "Parallelizing the Murphi Verifier," presented at Computer Aided Verification, 1997.

[21] T. Heyman, D. Geist, O. Grumberg, and A. Schuster, "Achieving Scalability in Parallel Reachability Analysis of Very Large Circuits," presented at Computer-Aided Verification, 2000.

[22] A. Narayan, A. Isles, J. Jain, R. Brayton, and A. L. Sangiovanni-Vincentelli, "Reachability Analysis using Partitioned-ROBDDs," presented at International Conference on Computer-Aided Design, 1997.

[23] A. Yadgar, "Parallel SAT Solving for Model Checking. www.cs.technion.ac.il/~yadgar/Research/research.pdf," 2002.

[24] M. Davis, G. Longeman, and D. Loveland, "A Machine Program for Theorem Proving," Communications of the ACM, vol. 5, pp. 394–397, 1962.

[25] A. Biere, A. Cimatti, E. M. Clarke, and Y. Zhu, "Symbolic Model Checking without BDDs," in Proceedings of Workshop on Tools and Algorithms for Analysis and Construction of Systems (TACAS), vol. 1579, LNCS, 1999.

[26] M. Sheeran, S. Singh, and G. Stalmarck, "Checking Safety Properties using Induction and a SAT Solver," in Proceedings of Conference on Formal Methods in Computer-Aided Design, 2000.

[27] A. Hasegawa, H. Matsuoka, and K. Nakanishi, "Clustering Software for Linux-Based HPC," NEC Research & Development, vol. 44, No. 1, pp. 60–63, 2003.

2. Related Work

With increasing design complexity of digital hardware, functional verification has become the most expensive and time-consuming component of the product development cycle according to some practitioners[1]. Verifying modern designs requires robust and scalable approaches in order to meet more-demanding time-to-market requirements. Formal verification techniques like symbolic model checking [2, 3], based on the use of Binary Decision Diagrams (BDDs) [4], offer the potential of exhaustive coverage and the ability to detect subtle bugs in comparison to traditional techniques like simulation. However, these techniques do not scale well in practice due to the state explosion problem.

SAT solvers enjoy several properties that make them attractive as a complement to BDDs. Their performance is less sensitive to the problem sizes and they do not suffer from space explosion. As a result, various researchers have developed routines for performing Bounded Model Checking (BMC) using SAT [5–8]. Unlike symbolic model checking, BMC focuses on finding bugs of a bounded length, and successively increases this bound to search for longer traces. Given a design and a correctness property, BMC techniques generate a Boolean formula, such that the formula is true if and only if there exists a witness/counterexample of length k. This Boolean formula is then checked by a backend SAT solver. Due to the many recent advances in SAT solvers [9–13], SAT-based BMC can handle much larger designs and analyze them faster than before.

A limitation of current applications of BMC is that it can do search up to a maximum depth allowed by the physical memory on a single server. This limitation comes from the fact that, as the search bound k becomes larger, the memory requirement due to unrolling of the design also increases. Especially for the memory-bound designs, a single server with a limited memory has now become a bottleneck to performing deeper search.

Parallelizing SAT solvers has been proposed by many researchers [14–19]. Most of these approaches target performance improvement of the SAT solver. These algorithms are based on partitioning the search space on different processors using partial assignments on the variables. Each processor works on the assigned space and communicates with other processors only after it is done searching its allocated portion of the search space. Such algorithms are not scalable, in terms of memory, due to high data redundancy. This is because, in such an approach each processor keeps the entire problem data (all clauses and variables).

In a closely related work on parallelizing SAT [16], the authors partition the problem by distributing the clauses evenly on many application specific processors. They use fine grain parallelism in the SAT algorithm to get better load balancing and reduce communication costs. Though they target the scalability issue by partitioning the clauses disjointedly, the variables appearing in the clauses are not disjoint. Therefore, whenever a Client finishes Boolean constraint propagation (BCP) on its set of clauses, it must broadcast the newly implied variables to all the other processors. The authors observed that over 90% of messages are broadcast messages. Broadcasting implications can become a serious communication bottleneck when the problem contains millions of variables.

Reducing the space requirement in model checking has been suggested in several related works [20–22]. These studies suggest partitioning the problem in several ways. The work discussed in [20] shows how to parallelize the model checker based on explicit state enumeration. They achieve it by partitioning the state table for reached states into several processing nodes. The work discussed in [21] discusses techniques to parallelize the BDD-based reachability analysis. The state space on which reachability is performed is partitioned into disjoint slices, where each slice is owned by one process. The process executes a reachability algorithm on its own slice. In [22], a single computer is used to handle one task at a time, while the other tasks are kept in external memory. In another paper [23], the author suggested a possibility of distributing SAT-based BMC but has not explored the feasibility of such an approach.

3. Discussions on Some Related Technology a) State-of-the-art SAT Solver

The Boolean Satisfiability (SAT) problem consists of determining a satisfying assignment for a Boolean formula on the constituent Boolean variables or proving that no such assignment exists. The problem is known to be NP-complete. Most SAT solvers [9–13] employ DPLL style [24] algorithm as shown in FIG. 2.

Three engines of a SAT solver are: decision, deduction, and diagnostic. The decision engine selects a new variable to branch on based on some heuristic. The deduction engine propagates the Boolean constant values on variables through implication (BCP). If a conflict occurs during BCP, the diagnostic engine analyzes the cause of conflict and adds reasons that prevent the same conflict in the future. This often leads to a non-chronological backtrack to some previous decision level which was responsible for the conflict. A Boolean problem can be ex-pressed either in CNF form or logical gate form or both. A hybrid SAT solver as in [12], where the problem is represented as both logical gates and a CNF expression, is well suited for BMC.

b) Bounded Model Checking

In BMC, the specification is expressed in LTL (Linear Temporal Logic), which includes the standard temporal operators—next time operator X, eventuality operator F, globally operator G, and until operator U. The design is described as a standard Kripke structure M=(S, I, T, L), with a finite set of states S, the set of initial states I, a transition relation between states T, and a labeling L of states with atomic propositions.

Given a Kripke structure M, an LTL formula f, and a bound k, the translation task in BMC is to construct a propositional formula $[M, f]_k$, such that the formula is satisfiable if and only if there exists a witness of length k [25]. The formula essentially consists of constraints due to the unrolled transition relation, and constraints due to the property being verified. The satisfiability check is performed by a backend SAT solver. Verification typically proceeds by looking for wit-nesses or counterexamples of increasing length. In practice, a separate argument is needed to determine when to stop, i.e., when a proof is complete [25, 26].

The overall algorithm of a SAT-based BMC for checking a simple safety property is shown in the FIG. 3. Given a bound k and the property node P, the algorithm checks the existence of a witness or counterexample of length less than or equal to k to the property P. The procedure Unroll is invoked at each unroll depth i to do the required unrolling of the circuit. After the unrolling, SAT is invoked to check the satisfiability of the problem on the unrolled circuit. If the SAT check succeeds, it returns WITNESS; else it continues until the bound k is reached, when it returns NO_WITNESS.

The SAT problems generated by the BMC translation procedure grow bigger as k increases. Therefore, the practical efficiency of the backend SAT solver becomes critical in enabling deeper searches to be performed.

II. SUMMARY

It will be significantly advantageous to overcome problems noted above. There is provided a method of solving a SAT problem comprising partitioning SAT-formula clauses in the SAT problem into a plurality of partitions. Each of said plurality of partitions is solved as a separate process each, thereby constituting a plurality of processes where each of said process communicates only with a subset of the plurality of processes.

In a specific enhancement, at least one of said processes runs on a separate processor.

In another specific enhancement, at least one process communicates only with another process with which it shares a variable interface.

In another specific enhancement, of said plurality of processes is a master process and rest of the plurality of processes are client processes.

More specifically, the master process controls distributed processing.

Even more specifically, the master process determines if any new decision needs to be made and returns a satisfied message if no new decisions need to be made.

Even more specifically, the master process returns an unsatisfied message if a determined backtrack level due to a conflict is zero.

Still more specifically, the master process maintains and processes learned clauses whose variables span across at least two of said plurality of partitions.

Still more specifically, the master process does not maintain an entire circuit information for a circuit corresponding to the SAT problem.

Still more specifically, boolean constraint propagation is performed as part of solving the SAT problem using distributed processing.

Even more specifically, a process requests an implication without receiving corresponding reply message.

Still more specifically, a process delays the processing of replies for which there is no corresponding request information currently available.

Another aspect of the disclosed teaching is a network for solving a SAT problem comprising a master process adapted to disjointedly partition a SAT problem into a set of disjoint partitions. A plurality of client processes are provided, each of said plurality of client processes adapted to receive and solve a separate disjoint partition each from the set of disjoint partitions. Each of said process communicates only with a subset of the plurality of processes.

In another specific enhancement, at least one of said plurality of client processes broadcasts messages related to an implication of said partitioning to the master process and the plurality of client processes.

In another specific enhancement, at least one client process is aware of a topology of the network.

More specifically, the messages are broadcast to only a subset of client processes from the set of client processes that share at least one partitioning interface with the at least one of said client processes.

Even more specifically, communications channels from said at least one of said client processes are restricted to only a subset of the client processes that are nearest neighbors of the least one of said client processes.

In another specific enhancement, the master process is adapted to maintain a FIFO queue where out-of order replies from the plurality of client processes are queued.

In another specific enhancement, at least one process communicates only with another process with which it shares a variable.

In yet another specific enhancement, the master process controls variable decisions.

In another specific enhancement, the master process maintains and processes learned clauses whose variables span across at least two of said plurality of partitions.

In still another specific enhancement, a master process determines if any new decision needs to be made and returns if no new decisions need to be made.

In yet another specific enhancement, a master process performs conflict analysis if a conflict is returned after the local boolean constraint propagation is performed.

In another specific enhancement the network is further adapted to solve a SAT-based Bounded Model Checking (BMC) problem, wherein the master process is adapted to convert the BMC problem originating from unrolling of a sequential circuit in different time frames into a SAT problem, and each client process is adapted to receive contiguous unrolled time frames.

More specifically, the master process requests a new unrolling to the client process that received the last unrolled time frame.

Still more specifically, the client process accepts the request and unrolls one time frame.

Even more specifically, the client unrolls additional time frames in advance when available memory is sufficient.

Still more specifically, the client does advance unrolling while it is waiting for implication request from the master.

In another specific enhancement, the client denies the request when available memory is not sufficient and the master requests a client that was not requested before.

In still anther specific enhancement, the master maintains the incremental learnt clauses from previous time frames.

More specifically, design is read and required initialization is done in all the clients a priori.

In another specific enhancement, the master process does not maintain the entire circuit information for a circuit corresponding to the SAT problem.

In yet another specific enhancement, Boolean constraint propagation is performed as part of solving the SAT problem using distributed processing.

More specifically, a process requests an implication without receiving corresponding reply message.

Still more specifically, a process delays the processing of replies for which there is no corresponding request information currently available.

III. BRIEF DESCRIPTION OF THE DRAWINGS

The disclosed teachings will become more apparent by describing in detail examples and embodiments thereof with reference to the attached drawings in which:

FIG. 2 shows an example of a pseudo-code for DPLL style SAT Solver.

FIG. 3 shows an example of a pseudo-code for SAT-based BMC for Safety Property P.

IV. DETAILED DESCRIPTION

IV.A. Overview of Distributed-SAT

Figure 1:
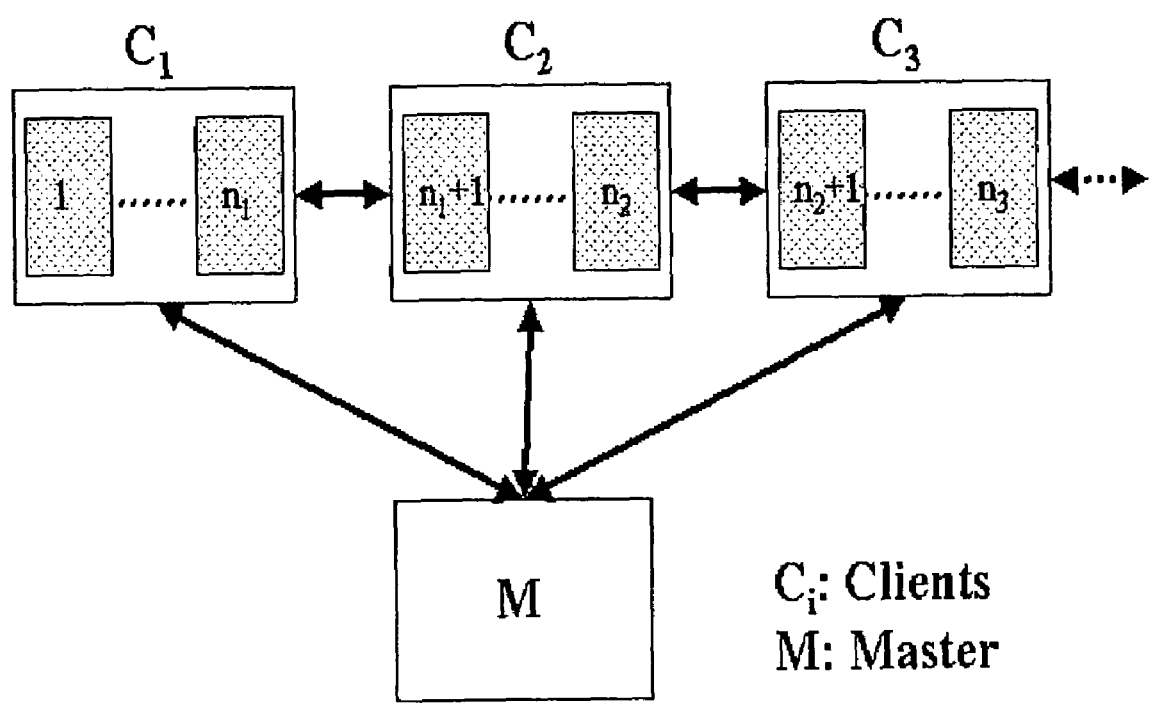
FIG. 1 shows an exemplary implementation of partitioning of an unrolled circuit.

Given an exclusive partitioning of the SAT problem, an overview of the fine grain parallelization of the three engines of the SAT algorithm (as described in Section I.C.3(a)) on a Master/Client distributed memory environment is provided. The Master controls the execution of the distributed-SAT. The decision engine is distributed in such a way that each Client selects a good local variable and the Master then chooses the globally best variable to branch on. During the deduction phase, each Client does BCP on its exclusive local partitions, and the Master does BCP on the global learned conflict clauses. Diagnosis is performed by the Master, and each Client performs a local backtrack when request by the Master. The Master does not keep all problem clauses and variables. However, the Master maintains the global assignment stack and the global state for diagnosis. This requires much less memory than the entire problem data. To ensure proper execution of the parallel algorithm, each Client is required to be synchronized. Details of the parallelization and different communication messages are discussed in subsequent sub-sections.

IV.B. Synopsis of the Disclosed Techniques

A technique for distributing SAT over a network of workstations using a Master/Client model where each Client workstation has an exclusive partition of the SAT problem is discussed herein. Some of the differences with related work is discussed herein. In some related work, though each client has disjoint set of clauses, variables are not disjoint. So, Clients after completing BCP, broadcast their new implications to all other Clients. In the disclosed technique, however, each Client has the knowledge of the SAT-problem partition topology and uses that to communicate with other clients. This is important, for example, because in a communication network where BCP messages dominate, broadcasting implications can be an overkill when the number of variables runs into millions. In some related work, for example [16], the techniques are developed for application specific processors. The techniques disclosed herein can use easily available existing networks of workstations. In an improvement, the effect of communication overhead on performance in general-purpose networks are reduced by identifying and executing tasks in parallel while messages are in transit.

As an example implementation, a prototype BMC tool is used as part of a formal verification platform called DiVer. Model checking tools based on efficient technologies for state space traversal, and for solving SAT problems form part of this implementation. The BMC engine is a component of this platform, and can be used for detecting bugs in large designs. The SAT-based BMC using topology-cognizant distributed-SAT is extended to obtain a SAT-based distributed BMC over a distributed-memory environment. For the sake of scalability, the disclosed technique ensures that at no point in the BMC computation does a single workstation have all the information.

The example distributed algorithms are developed for a network of processors based on standard Ethernet and using the TCP/IP protocol. Dedicated communication infrastructures could also be used. It should be noted that an environment that is easily available, and whose performance can be considered a lower bound can be used.

In the example implementation, a socket interface message passing library is used to provide standard bidirectional communications.

IV.C. Topology-Cognizant Distributed-BCP

BCP is an integral part of any SAT solver. In the disclosed techniques, BCP is distributed on multiple processes that are cognizant of topology of the SAT-problem partition running on a network of workstations. In related art, for example [16], during the distributed-SAT solve each Client broadcasts its implications to all other processors. After decoding the message, each receiving process either reads the message or ignores it. In the disclosed teachings, each process is made cognizant of the disjoint partitioning. The process then sends out implications to only those processes that share the partitioning interface variables with it.

Each receiving process simply decodes and reads the message. This helps in at least two ways: a) the receiving buffer of the process is not filled with useless information; b) receiving process does not spend time in decoding useless information. This ensures that the receiving process has to never read a message that is not meant for it.

The example implementation includes a distributed model with one Master and several Client processors. The Master's task is to distribute BCP on each Client that owns an exclusive partition of the problem. A bidirectional FIFO (First-in First-out) communication channel exists only between the process and its known neighbor, i.e., each process is cognizant of its neighbors. The process uses the partition topology knowledge for communication so as to reduce the traffic of the receiving buffer. A FIFO communication channel ensures that the channel is in-order, i.e., the messages sent from one process to another will be received in the order sent. Besides distributing BCP, the Master also records implications from the Clients as each Client completes its task.

A task for the Master is to maintain causal-effect ("happens before") ordering of implications in distributed-BCP since channel speeds and relative times of message arrivals during parallel BCP cannot be assumed. Maintaining such ordering is important because it is required for correct diagnosis during conflict analysis phase of SAT. This problem is discussed in detail with example techniques to overcome it.

Consider the Master/Client model as shown in FIG. 1. In the example implementation shown in FIG. 1, Client $C_i$ can communicate with $C_{i-1}$ and $C_{i+1}$ besides the Master M. The Master and Clients can generate implication requests to other Clients; however, Clients can send replies to the Master only for the request made to it. Along the reply message, Client also sends the message ids of the requests, if any, it made to the other Clients. This is an optimization step to reduce the number of redundant messages. To minimize reply wait time, the Master is allowed to send requests to the Clients even when there are implications pending from the Client provided that the global state (maintained by the Master) is not in conflict.

Let p→q denote an implication request from p to q and p←q denotes implication replies from q to p. Note that though the channel between $C_i$ and the Master is in order, what happens at the Event E3 cannot be guaranteed in the following:

E1: M→$C_1$
E2: $C_1$→$C_2$
E3: M←$C_2$ or M←$C_1$

If M←$C_2$ "happens before" M←$C_1$, then it is considered an out-of-order reply since the implications due to M←$C_2$ depend on $C_1$→$C_2$, which in turn depend on M→$C_1$. Moreover, any out-of-order reply from a Client makes subsequent replies from the Client out-of-order until the out-of-order reply gets processed.

A solution is proposed to handle out-of-order replies to the Master. For each Client, the Master maintains a FIFO queue where the out-of-order replies are queued. Since the channel between a Client and Master is in-order, this model ensures that messages in the FIFO will not be processed until the front of the FIFO is processed. The following short event sequence illustrates this. For simplicity the contents for FIFO for the Client $C_2$ are shown.

E1: M→$C_1$ FIFO($C_2$):—
E2: $C_1$→$C_2$ FIFO($C_2$):—
E3: M→$C_2$ FIFO($C_2$):—
E4: M←$C_2$ (in response to E2)FIFO($C_2$): E4

E5: M←$C_2$ (in response to E3) FIFO($C_2$): E4, E5
E6: M←$C_1$ (in response to E1) FIFO($C_2$):—(E4 is processed before E5)

Note that in the reply event E6, the Client $C_1$ also notifies the Master of the event E2. Master queues E4 reply as an out-of-order reply as it is not aware of the responsible event E2 until E6 happens. E5 reply is also queued as out-of-order as earlier out-of-order reply E4 has not been processed yet. When E6 occurs, the Master processes the messages from the events E6, E4 and E5 (in the order). This maintains the ordering of the implications in the global assignment stack.

IV.D. Distributed-BCP Algorithm

Figure 4:
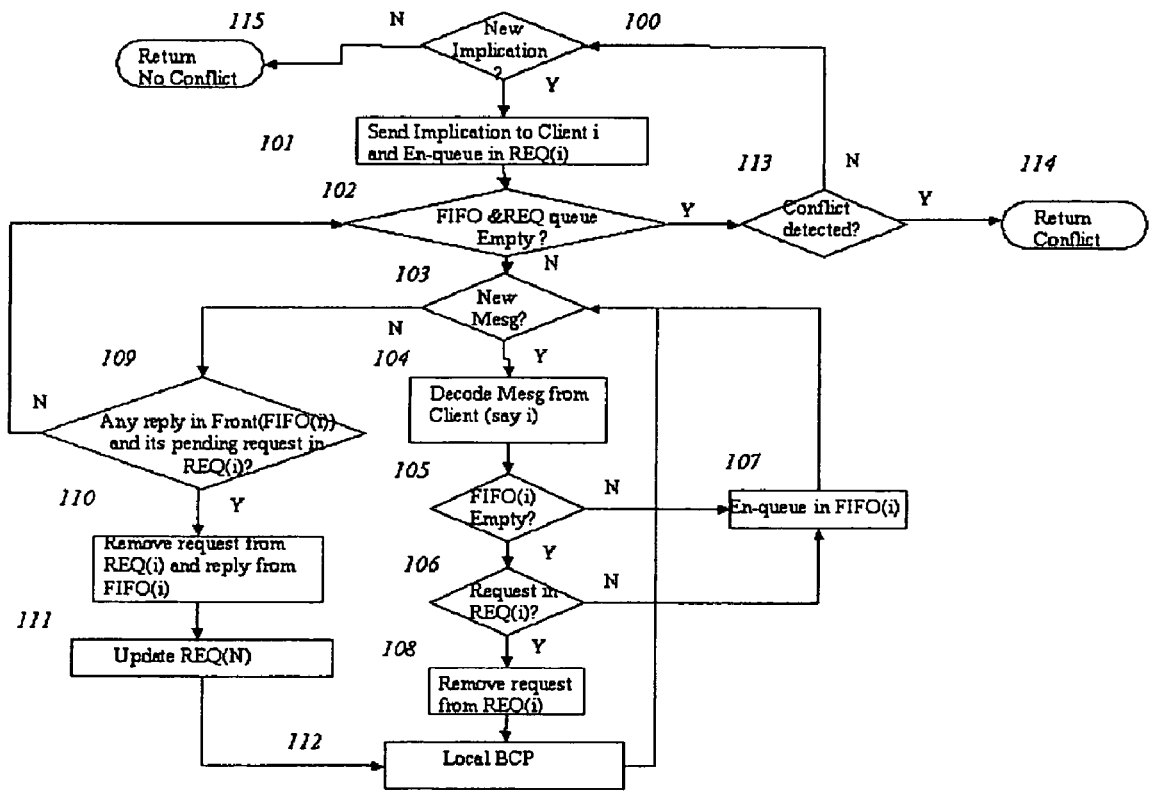
FIG. 4 shows an exemplary implementation of a Distributed-BCP.

The flow chart in FIG. 4 illustrates an example implementation of the Distributed-BCP algorithm. To begin, Master starts with a check to see if there is any new implication generated (box 100). If none are generated, it returns "No conflict" (box 115); otherwise, it sends implied variables to those Clients that own them for further implication (box 101). Simultaneously, it also en-queues the request in REQ (i) for each Client i that receives a new implication request. All out-of-order replies from Client i are en-queued in FIFO(i). The Master checks if there is any pending request or any un-processed out-of-order reply (box 102). If none, then it checks if there is any conflict detected during BCP (box 113). If none, then it proceeds to box 100; otherwise, it returns "conflict" (box 114). If box 102 check succeeds, the Master checks if there is any new message from some client (box 103). If yes, then it decodes the message from the Client (say i) (box 104). It checks if there is any message in out-of-order queue FIFO(i) for client i (box 105). If yes, then it en-queues the message in FIFO(i) and goes to box 103 (box 107); otherwise, it checks if the message has a pending request in REQ(i), i.e., not an out-of-order reply (box 106). If the message is an out-of-order reply, then the Master proceeds to box 107; else it removes the corresponding request from REQ(i) (box 108). Then, the Master does local BCP and records the conflict detected, if any, at this stage (box 112). The Master then goes back to box 103. If the box 103 check does not succeed, the Master checks if there is any out-of-order reply from some Client i that is at the front of FIFO(i) and whose request is also pending in REQ(i) (box 109). If yes, the Master removes the reply from the FIFO(i) and corresponding request REQ(i) queue (box 110). The Master also up-dates the request queue of Client i s neighbor N, i.e., REQ(N) depending on whether Client i has made implication request to its neighbor (box 111). The Master then proceeds to box 112. If the box 109 check fails, Master proceeds to box 102.

IV.E. Distributed-SAT

Figure 5:
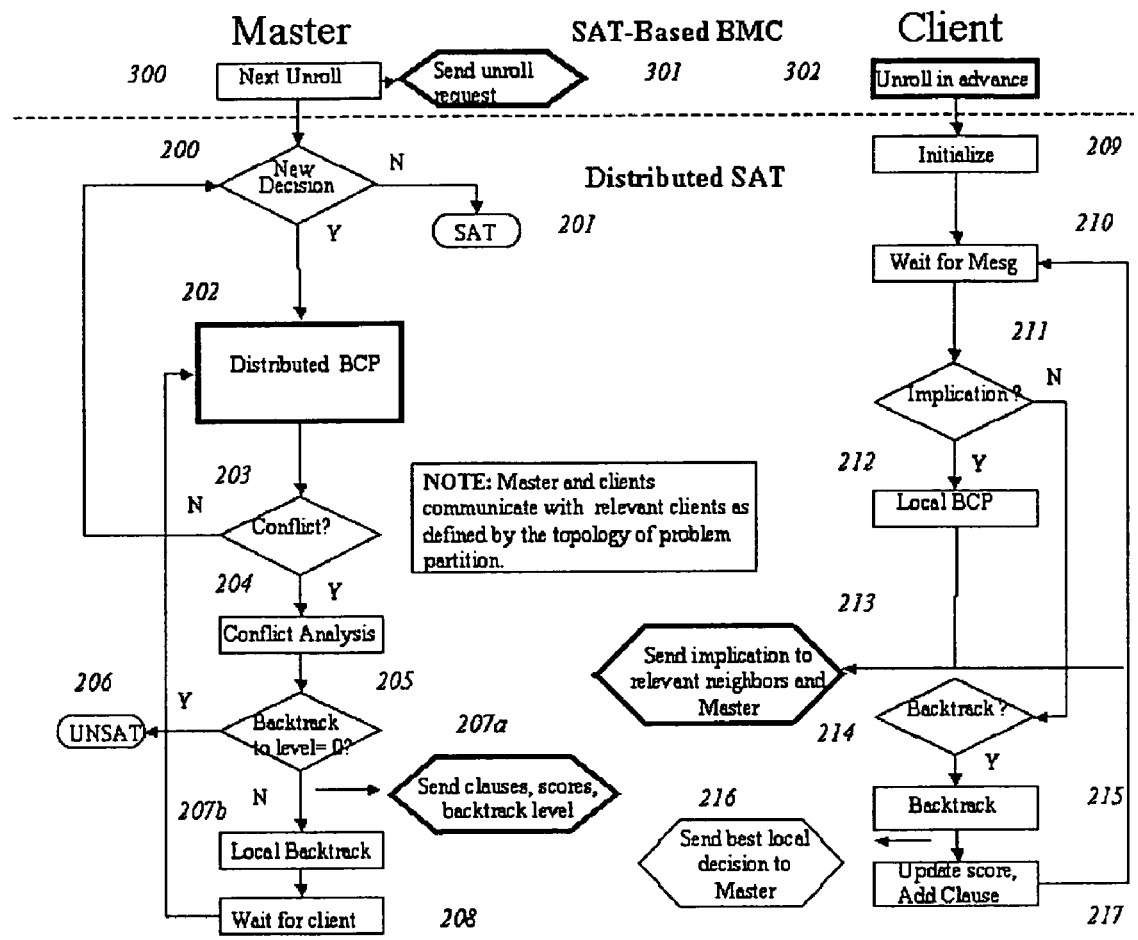
FIG. 5 shows an exemplary implementation of a Distributed-SAT and SAT-based Distributed-BMC.

Fine grain parallelism is used in the distributed-SAT algorithm disclosed herein. The topology-cognizant distributed-BCP (as described in the previous section) is used to carry out distributed-SAT over network of workstations. Task partitioning between the Master and Clients as shown in the FIG. 5, is discussed.

1. Tasks of the Master

Maintains list of constraints, global assignment stack, learnt clauses

Selects a new decision variable from the best local decision sent by each Client Global conflict analysis Local BCP on clauses; manages distributed-BCP Receives from $C_i$: New implications with antecedents and best local decision Sends to $C_i$: Implication on variables local to $C_i$ variables, backtrack request, learnt local clauses, update score request The task of the Master is discussed in detail as shown in FIG. 5. The Master checks if there is any new decision to be made (box 200). If none, then the problem is returned SAT (box 201). If yes, the Master proceeds to distributed-BCP as described in Section 4 (box 202). The Master then checks if the returned value is "conflict" (box 203). If not, then the Master proceeds to box 200; else the Master proceeds to conflict analysis (box 204). The Master then check if the backtrack level due to conflict is 0 (box 205). If yes, then the Master returns UNSAT (box 206); else it sends the local conflict clause learnt and variables scores to respective Clients. It also sends the backtrack level to all Clients (box 207a). Then, it does a local backtrack (207b). It then waits for the client to respond for the request of box 207 (box 208). When all neighboring Clients have replied, it proceeds to box 202.

2. Tasks of a Client

Maintains the ordered list of variables including update, decaying scores, local assignment stack, local learnt clauses Executes on request: backtrack, decay score, update variable score, local BCP Receives from Master: Implications, backtrack request, update Score, clause Receives from $C_j$: Implications on interface.

Sends to Master: New Implications with antecedents and best local decision, best local decision when requested, conflict node when local conflict occurs during BCP, request id when implication request comes from other Clients Sends to $C_j$: New implication requests to neighbors The task of Client is discussed in detail as shown in FIG. 5. Client after doing required initialization (box 209) waits for any new message (box 210). If there is a new message, Client checks if it is an implication request (box 211). If yes, then it performs local BCP (box 212). If required, it sends new implication request to neighboring Client. It replies to the Master with implications, antecedents and best scorer (box 213). Then it goes back to box 210. If the new message is backtrack (box 214), Client performs necessary backtrack (box 215). It then sends the best scorer to the Master (box 216). Later, it updates the score and adds the clause sent by the Master (box 217). Then, it proceeds to box 210.

IV.F. SAT-based Distributed-BMC

The SAT-based BMC implemented in the DiVer framework is extended with the distributed-SAT approach as described in Section IV.E to obtain a SAT-based distributed BMC.

A SAT-based BMC problem originating from an unrolling of the sequential circuit over different time frames has a natural linear partition and thereby allows configuring the computing resources in a linear topology. The topology using one Master and several Clients is shown in FIG. 1. Each Client $C_i$ is connected to $C_{i+1}$ and $C_{i-1}$. The Master controls the execution of the SAT-based distributed BMC algorithm. The BMC algorithm in FIG. 3 is different at least in the following respects. The Unroll procedure is now replaced by a distributed unrolling in which the procedure Unroll is actually invoked on the Client that hosts the partition for the depth i. Note that depending on the memory availability, the host Client is decided dynamically. After the unrolling, the distributed-SAT algorithm is invoked (in place of SAT) to check the satisfiability of the problem on the unrolled circuit that has been partitioned over several workstations. Following are the tasks distribution of the Master and Clients.

1. Tasks of the Master

Allocates an exclusive problem partition to each host Client (box 300 in FIG. 5)

Requests an unrolling to the terminal Client $C_n$ (box 301 in FIG. 5)

Maintains incremental learnt clauses from previous time-frames

Controls distributed-SAT as described previously.

2. Tasks of a Client

Handle current unroll request and also advance by one (box 302 in FIG. 5)

Initiate a new Client as defined by the topology when new unroll size is too large Participate in distributed-SAT

IV.G. Optimizations

1. Memory

The bookkeeping information kept by the Master grows with the unroll depth. The scalability of the distributed-BMC is determined by how low is the ratio of the memory utilized by the Master to the total memory used by the Clients. Following steps are taken to lower the scalability ratio:

By delegating the task of choosing the local decision and maintaining the ordered list of variables to the Client, the memory otherwise used by the Master is saved.

Master does not keep the entire circuit information anytime. It relies on the Clients to send the reasons of implications that will be used during diagnosis.

In the experiments, it is observed that the scalability ratio for large designs is close to 0.1, which implies that a 10 times deeper can be done search using a distributed-BMC as compared to a non-distributed (monolithic) BMC over network of similar machines.

2. Performance

Several performance optimization strategies are discussed for distributed SAT and SAT-based distributed-BMC. Inter-workstation communication time can be significant and adversely affects the performance. We can mitigate this overhead by hiding execution of certain tasks behind the communication latency.

To have some idea of communication overhead, we first need some strategy to measure the communication overhead and actual processing time. This is non-trivial due to asynchronous clock domain of the workstations. In the following, we first discuss a simple strategy and then an improved strategy to make a tight estimate of the wait time incurred by the Master due to inter-workstations communication in Parallel BMC.

Figure 6:
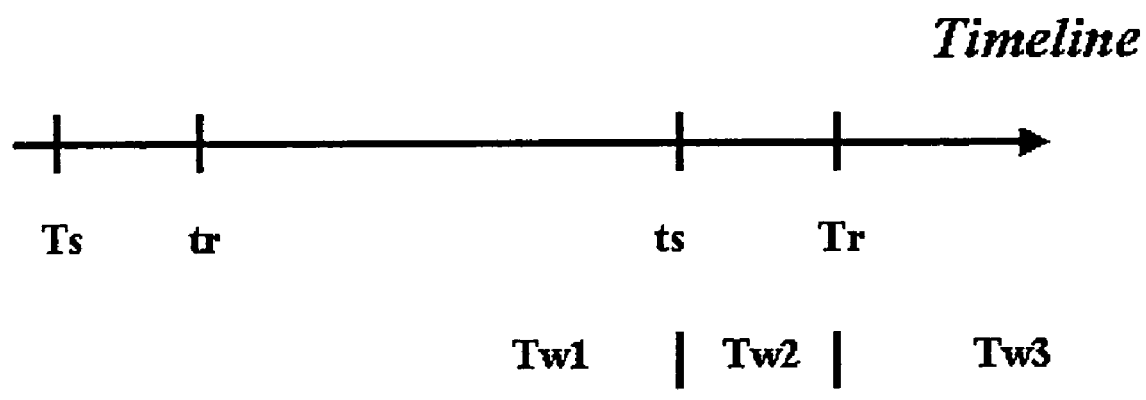
FIG. 6 shows an example of a Message Transmission Timeline.

Consider a request-reply communication as shown in FIG. 6. Time stamps shown are local to the Master and Client. At time $T_s$, the Master sends its request to the Client. The Client receives the message at its time $t_r$. The Client processes the message and sends the reply to the Master at time $t_s$. The Master, in the meantime, does some other tasks and then starts waiting for the message at time $T_w$ (shown as $T_{w1}, T_{w2}, T_{w3}$ in the figure). The Master receives the message at time $T_r$.

Without accounting for the Client processing time, wait time would be simply, $$\text{Wait\_Time} = T_r - T_w \text{ if } T_r > T_w = 0 \text{ othewise}$$

This calculated wait time would be an over-estimation of the actual wait time. To account for the Client processing time, we propose the following steps:

Master sends the request with $T_s$ embedded in the message. Client replies back to the Master with the time stamp $(T_s + (t_s - t_r))$.

The Master, depending on the time $T_w$, calculates the actual wait time as follows:

Case Tw1: $T_w < (T_s + (t_s - t_r))$ $$\text{Wait\_Time} = T_r - (T_s + (t_s - t_r))$$

Case Tw2: $(T_s + (t_s - t_r)) < T_w < T_r$ $$\text{Wait\_Time} = T_r - T_w$$

Case Tw3: $T_r < T_w$ i.e. Master does not wait.

$$\text{Wait\_Time} = 0$$

3. Performance Optimizations in Distributed-SAT

Several performance optimizations in the distributed-SAT algorithm are discussed.

A large number of communication messages tend to degrade the overall performance. We took several means to reduce the overhead:

The Master waits for all Clients to stabilize before sending a new implication request. This reduces the number of implication messages sent.

Clients send it best local decision along with every implication and backtrack replies. At the time of decision, the Master, therefore, only selects from the best local decisions. It is not required to make explicit requests for a decision variable to each Client separately.

For all implication requests, Clients send replies to only the Master. This reduces the number of redundant messages on the network.

Client sends active variables to the Master before doing the initialization. While the Master waits and/or processes the message, the Client does its initialization in parallel.

When Master requests each Client to backtrack, it has to wait for the Clients to respond with a new decision variable. The following overlapping tasks are done to mitigate the wait time:

Local backtrack (box 207b in FIG. 5) by the Master is done after the remote request is sent (box 207b in FIG. 5). While the Master waits for the decision variable from the Client, the Master also sends the learnt local conflict clauses to the respective Client.

The function for adjusting variable score (box 217 in FIG. 5) is invoked in the Client after it sends the next decision variable (during backtrack request from the Master) (box 216 in FIG. 5). Since message-send is non-blocking, potentially the function is executed in parallel with send. On the downside, the decision variable that is chosen may be a stale decision variable. However, note that the local decision variable that is sent is very unlikely be chosen as decision variable. The reason is that in the next step after backtrack there will be an implication. Since the Client sends the decision variable after every implication request, the staleness of the decision variable will be eventually eliminated.

4. Optimization in SAT-based Distributed-BMC

Optimizations in the SAT-based distributed-BMC algorithm is discussed herein.

The design is read and initialization is done in all the clients to begin with. This reduces the processing time when the unrolling is initiated onto a new Client Advance unrolling is done in the client while the client is waiting for implication request from the Master. This includes invoking a new partition in a new Client.

IV.H. Experiments

The described experiments were conducted to evaluate distributed-SAT and SAT-based distributed BMC on a network of workstations, each composed of dual Intel 2.8 GHz Xeon Processor with 4 Gb physical memory running Red Hat Linux 7.2, interconnected with a standard 10 Mbs/100 Mbs/1 Gbps Ethernet LAN. The performance and scalability of the disclosed distributed algorithm are compared with a non-distributed (monolithic) approach. The communication overhead is also measured using the accurate strategy as described in this disclosure.

The first set of experiments was performed to measure the performance penalty and communication overhead for the distributed algorithms. Implementation of the disclosed SAT-based distributed algorithm was employed on 15 large industrial examples, each with a safety property. For these designs, the number of flip-flops ranges from ~1K to ~13K and number of 2-input gates ranges from ~20K to ~0.5M. Out of 15 examples, 6 have counter examples and the rest do not have counterexample within the bound chosen.

In the example implementation used for the experiments, a Master (referred to as M) and 2 Clients (referred as $C_1$ and $C_2$) model were used where $C_1$ and $C_2$ can communicate with each other. A controlled environment was used for the experiment under which, at each SAT check in the distributed-BMC, the SAT algorithm executes the tasks in a distributed manner as described earlier except at the time of decision variable selection and backtracking, when it is forced to follow the sequence that is consistent with the sequential SAT. Three different settings of the Ethernet switch were used to show how the network bandwidth affects the communication overheads. The results of the controlled experiments are presented in Table 1a and Table 1b.

In Table 1a, the 1st Column shows the set of designs (D1–D6 have a counterexample), the 2nd Column shows the number of Flip Flops and 2-input Gates in the fanicone of the safety property in the corresponding design, the 3rd Column shows the bound depth limit for analysis, the 4th Column shows the total memory used by the non-distributed BMC, the 5th Column shows the partition depth when Client $C_2$ took an exclusive charge of the further unrolling, Columns 6-8 show the memory distribution among the Master and the Clients. In the Column 9, the scalability ratio, i.e., the ratio of memory used by the Master to that of the total memory used by Clients was calculated. It is observed that for larger designs, the scalability factor is close to 0.1 though for comparatively smaller designs, this ratio was as high as 0.8. This can be attributed to the minimum bookkeeping overhead of the Master. Note that even though some of the designs have same number of flip-flops and gates, they have different safety properties. The partition depth chosen was used to balance the memory utilization; however, the distributed-BMC algorithm chooses the partition depth dynamically to reduce the peak requirement on any one Client processor.

In Table 1b, the 1st Column shows the set of designs used (same as in Table 1a), the 2nd Column shows the cumulative time taken (over all steps) by non-distributed BMC, the 3rd Column shows the cumulative time taken (over all steps) by our distributed-BMC excluding the message wait time, Columns 4-6 show the total message wait time for the Master in a 10/100/1000 Mbps Ethernet Switch setting. In the Column 7, the performance penalty is calculated by taking the ratio of the time taken by distributed to that of non-distributed BMC (=Para Time/Mono Time). In the Column 8, the communication overhead is calculated for the 1 Gbps switch setting by taking the ratio of the message waiting time to distributed BMC time (=wiat time for 1 Gbps/Para Time). On average it is found that the performance penalty is 50% and communication overhead is 70%.

TABLE 1a

Memory utilization of the distributed SAT-based BMC

| Ex | FF/Gate | D | Mono Mem (Mb) | Part Depth | Para Mem (Mb) | | | S Ratio |
|---|---|---|---|---|---|---|---|---|
| | | | | | M | C1 | C2 | |
| D1 | 4.2K/30K | 16 | 20 | 5 | 8 | 5 | 16 | 0.4 |
| D2 | 4.2K/30K | 14 | 18 | 5 | 8 | 6 | 13 | 0.4 |
| D3 | 4.2K/30K | 17 | 21 | 5 | 9 | 5 | 17 | 0.4 |
| D4 | 4.2K/30K | 9 | 10 | 5 | 3 | 4 | 6 | 0.3 |
| D5 | 4.2K/30K | 15 | 18 | 5 | 8 | 5 | 15 | 0.4 |
| D6 | 4.2K/30K | 7 | 8 | 5 | 2 | 4 | 4 | 0.3 |
| D7 | 4.2K/30K | 21 | 24 | 5 | 7 | 4 | 20 | 0.3 |
| D8 | 1.0K/18K | 55 | 68 | 30 | 20 | 35 | 31 | 0.3 |
| D9 | 0.9K/18K | 67 | 124 | 30 | 65 | 33 | 49 | 0.8 |
| D10 | 5.2K/37K | 21 | 29 | 5 | 10 | 4 | 24 | 0.4 |
| D11 | 12.7K/448K | 61 | 1538 | 45 | 172 | 1071 | 480 | 0.1 |
| D12 | 3.7K/158K | 81 | 507 | 40 | 47 | 246 | 267 | 0.1 |
| D13 | 3.7K/158K | 41 | 254 | 20 | 24 | 119 | 141 | 0.1 |
| D14 | 3.7K/158K | 81 | 901 | 40 | 149 | 457 | 447 | 0.2 |
| D15 | 3.7K/158K | 81 | 901 | 40 | 135 | 457 | 443 | 0.2 |

TABLE 2b

Performance evaluation and communication overhead

| Ex | Mono Time(s) | Para Time(s) | MWT (sec) | | | Perf Pnlty | Com Ovr |
|---|---|---|---|---|---|---|---|
| | | | 1 Gbps | 100 Mbs | 10 Mbs | | |
| D1 | 8.9 | 12.8 | 11.4 | 34.5 | 991.2 | 1.4 | 0.9 |
| D2 | 4.2 | 6.7 | 10.5 | 24.2 | 698.6 | 1.6 | 1.6 |
| D3 | 9.7 | 15.6 | 11.2 | 33.2 | 767.9 | 1.6 | 0.7 |
| D4 | 0.8 | 1.9 | 1.8 | 3.8 | 107.7 | 2.4 | 0.9 |
| D5 | 5.2 | 8.2 | 10 | 31.4 | 680.5 | 1.6 | 1.2 |
| D6 | 0.3 | 1.1 | 0.6 | 1.6 | 45.1 | 3.7 | 0.5 |
| D7 | 9.5 | 14.7 | 9 | 40 | 855.3 | 1.5 | 0.6 |
| D8 | 37.9 | 52.1 | 22.1 | 109 | 1895.3 | 1.4 | 0.4 |
| D9 | 314.6 | 454.5 | 130 | 702.4 | 12922.9 | 1.4 | 0.3 |
| D10 | 23.4 | 38.4 | 17.8 | 71.8 | 764.1 | 1.6 | 0.5 |
| D11 | 919 | 1261.4 | 1135.7 | 2403 | 5893.2 | 1.4 | 0.9 |
| D12 | 130.5 | 89.1 | 0.1 | 65.1 | 63.2 | 0.7 | 0.0 |
| D13 | 33.7 | 23.2 | 0.4 | 6.3 | 16.1 | 0.7 | 0.0 |
| D14 | 452.8 | 360.6 | 87.4 | 653.5 | 1288.6 | 0.8 | 0.2 |
| D15 | 442.2 | 344.6 | 97.2 | 679.9 | 1138.5 | 0.8 | 0.3 |

In some cases, D12–D15, though we find an improvement in performance over non-distributed BMC. This is due to the exploitation of parallelism during the Client initialization step as described in this disclosure. Note that the message wait time adversely gets affected with lowering the switch setting from 1 Gbps to 10 Mbps This is attributed to the fact that Ethernet LAN is inherently a broadcast non-preemptive communication channel.

In the second set of experiments, the 5 largest (of 15) designs D11–D15 that did not have a witness were used. For distributed-BMC, five workstations were configured in to one Master and 4 Clients $C_{1-4}$; each connected with the 1 Gbps Ethernet LAN. In this setting, Clients are connected in a linear topology and the Master is connected in a star with others. In this experiment, the ability of the distributed-BMC to do deeper search using distributed memory is shown. For the design D11, a partition of 81 unroll depths is used on each Client and for designs D12–15, partition of 401 unroll depths is used on each Clients. The results are shown in the Table 2.

In Table 2, the 1st Column shows the set of large designs that were hard to verify, the 2nd Column shows the farthest depth to which non-distributed BMC could search before it runs out of memory, the 3rd Column shows the time taken to reach the depth in the Column 2nd, the 4th Column shows the unroll depth reached by distributed-BMC using the allocated partition, the 5th Column shows the time taken to reach the depth in the Column 4th excluding the message wait time, Columns 6–10 show the memory distribution for the Master and Clients, the 11th Column shows the total message wait time. In the Column 12, the communication overhead is calculated by taking the ratio of message wait time to the distributed-BMC time (=MWT time/ Para Time). In the Column 13, the scalability ratio is calculated by taking the ratio of memory used by the Master to that of the total memory used by the Clients.

TABLE 2

Comparison of non-distributed and distributed BMC on large Industrial designs

| Ex | Mono Depth | Mono Time (sec) | Para Depth | Para Time (sec) | Para Memory (in Mb) | | | | MWT (sec) | Comm Ovrhd | S Ratio |
| --- | --- | --- | --- | --- | --- | --- | --- | --- | --- | --- | --- |
| | | | | | M | C1 | C2 | C3 | C4 | | |
| D11 | 120 | 1642.3 | 323 | 6778.5 | 634 | 1505 | 1740 | 1740 | 1730 | 1865.1 | 0.3 | 0.1 |
| D12 | 553 | 4928.3 | 1603 | 13063.4 | 654 | 1846 | 1863 | 1863 | 1863 | 5947.7 | 0.5 | 0.1 |
| D13 | 553 | 4899.5 | 1603 | 12964.5 | 654 | 1846 | 1864 | 1864 | 1864 | 5876.8 | 0.5 | 0.1 |
| D14 | 567 | 642.8 | 1603 | 2506.2 | 654 | 1833 | 1851 | 1851 | 1851 | 1585.4 | 0.6 | 0.1 |
| D15 | 567 | 641.9 | 1603 | 1971.5 | 654 | 1833 | 1851 | 1851 | 1851 | 879.6 | 0.4 | 0.1 |

The design D11 with ~13K flip-flops and ~0.5 Million gates is used to show the performance comparison. For the design D11 could be analyzed up to a depth of 323 with only 300% communication overhead, while using a non-distributed version we could analyze only up to 120 time frames under the per-workstation memory limit. Low scalability factor, i.e., 0.1 for large designs indicates that for these designs our distributed-BMC algorithm could have gone 10 times deeper compared to the non-distributed version for similar set of machines. It is also observed that the communication overhead for these designs was about 45% on average, a small penalty to pay for deeper search.

For verifying designs with high complexity, we need a scalable and robust solution. SAT-based BMC is quite popular because of its robustness and better debugging capability. Although, SAT-based BMC is able to increasingly handle larger designs than before as a result of advancement of SAT solvers, the memory of a single server has become a serious limitation to carrying out deeper search. Existing parallel algorithms either focus on improving the SAT performance or have been used in either explicit state-based model checkers or in unbounded implicit state-based model checkers.

The disclosed distributed algorithm uses the normally available large pool of workstations that are inter-connected by standard Ethernet LAN. For the sake of scalability, our distributed algorithm makes sure that no single processor has the entire data. Also, each process is cognizant of the partition topology and uses the knowledge to communicate with the other process; thereby, reducing the process's receiving buffer with unwanted information. Several memory and performance optimization schemes to achieve scalability and decrease the communication overhead is also proposed. On an industrial design with ~13K FFs and ~0.5M gates, the non-distributed BMC on a single workstation (with 4 Gb memory) ran out of memory after reaching a depth of 120; on the other hand, the disclosed SAT-based distributed BMC over 5 similar workstations was able to go up to 323 steps with a communication overhead of only 30%.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A method of solving a SAT problem comprising:
   partitioning SAT-formula clauses in the SAT problem into a plurality of partitions; and
   solving each of said plurality of partitions as a separate process each, thereby constituting a plurality of processes
   wherein each of said processes is cognizant of a topology of the partitioning; and
   wherein each of said processes communicates only with a subset of the plurality of processes and
   wherein at least one process communicates only with another process with which it shares a variable interface.

2. The method of claim 1, wherein at least one of said processes runs on a separate processor.

3. The method of claim 1, wherein one of said plurality of processes is a master process and rest of the plurality of processes are client processes.

4. The method of claim 3, wherein the master process controls distributed processing.

5. The method of claim 4, wherein the master process determines if any new decision needs to be made and returns a satisfied message if no new decisions need to be made.

6. The method of claim 4, wherein the master process returns an unsatisfied message if a determined backtrack level due to a conflict is zero.

7. The method of claim 3, wherein the master process maintains and processes learned clauses whose variables span across at least two of said plurality of partitions.

8. The method of claim 3, wherein the master process does not maintain an entire circuit information for a circuit corresponding to the SAT problem.

9. The method of claim 3, wherein boolean constraint propagation is performed as part of solving the SAT problem using distributed processing.

10. The method of claim 9, wherein a process requests an implication without receiving corresponding reply message.

11. The method of claim 9, wherein a process delays the processing of replies for which there is no corresponding request information currently available.

12. The method of claim 9, wherein the master controls the distributed Boolean constraint propagation comprising:

a) returning no conflict message if a new implication does not exist, else sending the new implication to a corresponding client process;
b) en-queuing the new implication in a request queue corresponding to a client process;
c) en-queuing all out-of-order reply messages from a first client process into a FIFO queue corresponding to the first client process;
d) returning conflict if detected during local Boolean constraint propagation or due to conflict reply message from one or more clients, else returning to step a if the FIFO and the request queues are empty;
e) checking for a new reply message if the FIFO or request queue is not empty, if message does not exist proceeding to step 1 else proceeding to step f;
f) decoding a new reply message;
g) en-queueing the new reply message in a FIFO queue corresponding to a client process and returning to step e if the FIFO queue corresponding to the client process is not empty;
h) checking if a request exists in the corresponding request queue of the client process;
i) returning to step g if the reply message is out-of-order;
j) removing the request from the corresponding request queue if the corresponding reply message is not out-of-order;
k) performing local Boolean constraint propagation and returning to step e;
l) checking if any reply message exists at a head of the FIFO queue for a second client process corresponding to a pending request for the second client process, if message exists then going to step m, else returning to step d; and
m) removing the pending request and the reply message if the reply message exists in step l, updating request queues for client processes other than said second client process if required, and performing a local Boolean constraint propagation.

13. The method of claim 9, wherein each client process participates in the distributed Boolean constraint propagation using a sub-process comprising:
a) performing local Boolean constraint propagation if a new message is an implication request;
b) sending a new implication request to neighboring client processes if conflict does not occur;
c) sending a reply with antecedents corresponding to implications and best score variable to the master process; and
d) sending conflict message if conflict occurs.

14. The method of claim 9, wherein the master process performs global conflict analysis on detecting conflict during distributed Boolean constraint propagation using a sub-process comprising:
a) performing conflict analysis using global assignment stack;
b) sending learnt local conflict clauses and updated variable scores to respective clients;
c) sending backtrack level to the client processes; and
d) performing local backtrack.

15. The method of claim 14, wherein step d is done after steps a, b, and c.

16. The method of claim 3, wherein each client process participates in global conflict analysis using a sub-process comprising:
a) sending best score variable to the master process;
b) performing local backtrack on receiving a backtrack request message;
c) updating scores on receiving an updated variable score message; and
d) adding learnt local conflict clauses on receiving a conflict clause message.

17. The method of claim 16, wherein step a is done before steps b, c, and d.

18. The method of claim 3, wherein the master process decides on a next variable by choosing best score variables sent by the client processes.

19. The method of claim 3, wherein each client process participates in the decision making using a sub-process comprising:
a) maintaining a list of ordered variables local to said each client process;
b) sending a best score variable after implication replies to the master process; and
c) updating the list when requested.

20. A method of claim 3, wherein said process is used for solving a SAT-based Bounded Model Checking (BMC) problem, wherein the master process converts the BMC problem originating from unrolling of a sequential circuit in different time frames into a SAT problem, and each client process is adapted to receive contiguous unrolled time frames.

21. The method of claim 20, wherein the master process requests a new unrolling to the client process that received the last unrolled time frame.

22. The method of claim 21, wherein the client process denies the request when available memory is not sufficient and the master process requests a client that was not requested before.

23. The method of claim 21, wherein the client process accepts the request and unrolls one time frame.

24. The method of claim 23, wherein in the client process unrolls additional time frames in advance when available memory is sufficient.

25. The method of claim 24, wherein the client process does advance unrolling while the client process is waiting for implication request from the master process.

26. The method of claim 20, wherein the master process maintains incremental learnt clauses from previous time frames.

27. The method of claim 20, wherein a design is read and required initialization is done in all the client processes a priori.

* * * * *